（12）United States Patent
Goh

(10) Patent No.: US 8,637,352 B2
(45) Date of Patent: Jan. 28, 2014

(54) BALL GRID ARRAY TO PIN GRID ARRAY CONVERSION

(75) Inventor: Kim-Yong Goh, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 0 days.

(21) Appl. No.: 13/302,602

(22) Filed: Nov. 22, 2011

(65) Prior Publication Data

US 2013/0127041 A1    May 23, 2013

(51) Int. Cl.
*H01L 21/00* (2006.01)

(52) U.S. Cl.
USPC .......................................... 438/123; 438/112

(58) Field of Classification Search
USPC .................... 438/112, 123; 257/737, 738, 739
See application file for complete search history.

(56) References Cited

U.S. PATENT DOCUMENTS

| | | | |
|---|---|---|---|
| 6,272,741 B1 | 8/2001 | Kennedy et al. | |
| 2007/0284706 A1* | 12/2007 | Cherian | 257/666 |
| 2008/0050859 A1* | 2/2008 | Wallace | 438/123 |

* cited by examiner

*Primary Examiner* — Walter H Swanson
*Assistant Examiner* — Wilner Jean Baptiste
(74) *Attorney, Agent, or Firm* — Seed IP Law Group PLLC

(57) ABSTRACT

Ball grid array to pin grid array conversion methods are provided. An example method can include coupling a plurality of solder balls to a respective plurality of pin grid array contact pads. Each of the plurality of solder balls is encapsulated in a fixed material. A portion of the plurality of solder balls and a portion of the fixed material is removed to provide a plurality of exposed solder balls. The exposed solder balls are softened and each of a plurality of pin members is inserted in a softened, exposed, solder ball. The plurality of pin members forms a pin grid array package.

12 Claims, 6 Drawing Sheets

300A

300B

BALL GRID ARRAY TO PIN GRID ARRAY CONVERSION

BACKGROUND

1. Technical Field

This disclosure generally relates to packaging of integrated circuits and particularly relates to conversion of ball grid array (BGA) packages to pin grid array (PGA) packages.

2. Description of the Related Art

The packaging of integrated circuits (ICs) frequently depends upon the expected method for board mounting the ICs. Two of the IC packaging methods in widespread use are ball grid array (BGA) packaging and pin grid array (PGA) packaging. The semiconductor die within a BGA packaged IC is electrically coupled to "pads" disposed on a surface of the BGA package. Small solder balls are bonded to each of the BGA contact pads. Coupling the BGA package to an underlying circuit board is accomplished by melting the solder to provide the electrical and physical coupling between the BGA package and the underlying circuit board. Since the BGA package is mounted directly on the circuit board, the board space and height of the mounted BGA package is minimized. The relatively low height of the BGA package provides a popular and cost-effective solution for mounting ICs in smaller devices such as handheld computer and cellular telephones.

In contrast, the semiconductor die within a PGA package is electrically coupled to "pins" extending from a surface of the PGA package. Electrically coupling the PGA package to an underlying circuit board is accomplished by inserting the pins into a complimentary socket that is electrically and physically coupled to the underlying circuit board. Since the PGA package is coupled to a socket, PGA packaging is attractive where post-manufacture removal of the IC is necessary, for example, where availability of user replaceable components is envisioned. Currently costly different production lines are needed to manufacture BGA and PGA packages due to their inherently different physical architecture.

FIG. 1 is a prior art example demonstrating an attempt to use an external adapter 105 to permit a ball grid array package to be used in a socket made for a pin grid array package. The semiconductor die 110 is electrically coupled to the adapter 105 using a plurality of solder balls 115 as a standard BGA. The adapter 105 includes an insulating substrate 120 having a plurality of conductive pads 125 disposed thereupon. A plurality of conductors or vias 130 extends through the insulating substrate 120 to link each of the conductive pads 125 with a respective pin 135. The substrate 120 can include a variety of structures and conductive layers that when coupled to the plurality of vias 130 connect one or more of the conductive pads 125 to pins 135. The pins 135 become the pin grid array.

FIG. 2 is another prior art example demonstrating the use of another external pin grid array adapter 205 to permit a ball grid array package to be used in a socket made for a pin grid array package. Similar to the adapter 105 discussed above, the semiconductor die 210 is electrically coupled to the adapter 205 using a plurality of solder balls 215 as a standard BGA package. The adapter 205 includes an insulated substrate 220. Apertures are formed in the substrate 220 and the pins 230 are inserted in the through apertures. The pins 230 have enlarged heads 225 which are exposed on the top side of the adaptor 220. The apertures are formed in the substrate 220 at a location to align with the balls on the BGA package so that the enlarged head 225 of each pin 230 is assured of contacting a ball. Each of at least a portion of the heads 225 align with each of the solder balls 215 disposed on the surface of the ball grid array package 235. The pin grid array adapter 205 is coupled to the ball grid array package 235 by heating the solder balls 215 to provide the physical and electrical coupling between the ball grid array package 235 and the external pin grid array adapter 205.

To create the pin grid array package, the adapters depicted in FIGS. 1 and 2 both depend upon the coupling of an external pin grid array adapter 105, 205 to the ball grid array semiconductor die 110, 210, respectively. Multiple adapters 105, 205 are therefore needed to accommodate the wide variety of ball grid array packages. For every configuration of a ball grid array an entirely new design of an adaptor is needed, which requires additional time and tooling to prepare. Additionally, the need to conserve space within small form factor devices may limit or otherwise restrict the ability to use an "oversize" external pin grid array adapter having a sufficient pin count. Consequently, in certain applications, the external pin grid array adapter 105, 205 must be matched to an individual ball grid array. Any changes, design evolution, or modification to the ball gray array will require comparable time-consuming and expensive changes in the external pin grid array adapter 105, 205. Further, time and effort are required to align the adaptors with the BGA package and slight misalignment results in defective electrical connections. In some cases, the adapter might break apart from the package. A method enabling flexible and cost effective conversion of a ball grid array package to a pin grid array package is therefore desirable.

BRIEF SUMMARY

According to principles as explained herein, a pin grid array package is formed by first attaching solder balls to contact pads to create a standard ball grid array package. The solder balls are then encapsulated within a fixed material. A portion of the solder balls and a portion of the fixed material are removed to expose the solder balls. The now exposed solder balls are held in contact with the contact pads on the ball grid array by the fixed material encapsulating the solder balls. The exposed solder balls and the residual fixed material provide a planar surface on the ball grid array.

The exposed solder balls are softened by heating the planar surface containing the residual fixed material and the solder balls. A pin member is inserted into each of the softened solder balls. After the solder ball solidifies, a portion of the pin member projects from the solder ball. The projecting pin members form a pin grid array that is coupled to the ball grid array contact pads via the solder balls. Thus, no adapters or intervening structures are necessary to fully convert a package from a ball grid array package to a pin grid array package.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc.

Unless the context requires otherwise, throughout the specification and claims which follow, the word "comprise" and variations thereof, such as "comprises" and "comprising" are to be construed in an open, inclusive sense, that is, as "including, but not limited to."

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

Figure 1:
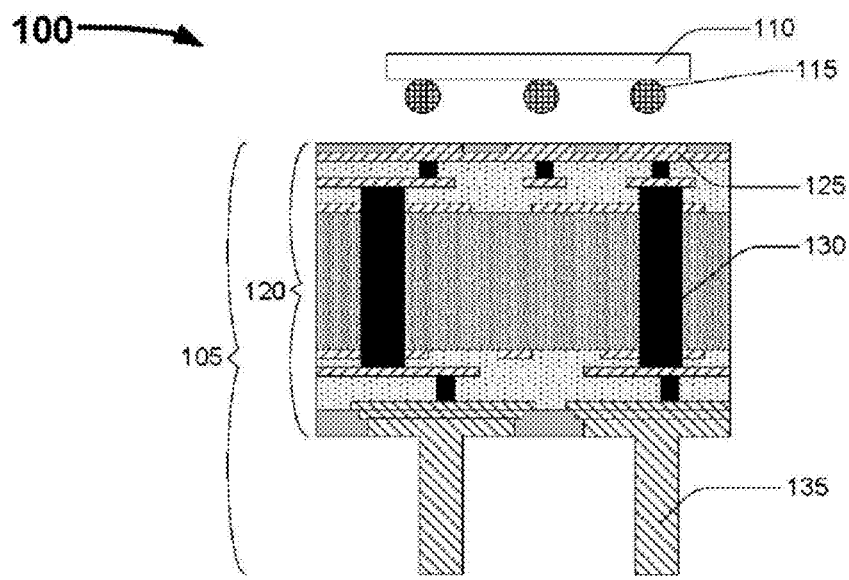
FIG. 1 is a sectional elevation view of a prior art external pin grid array (PGA) adapter coupled to a ball grid array (BGA) package.
Figure 2:
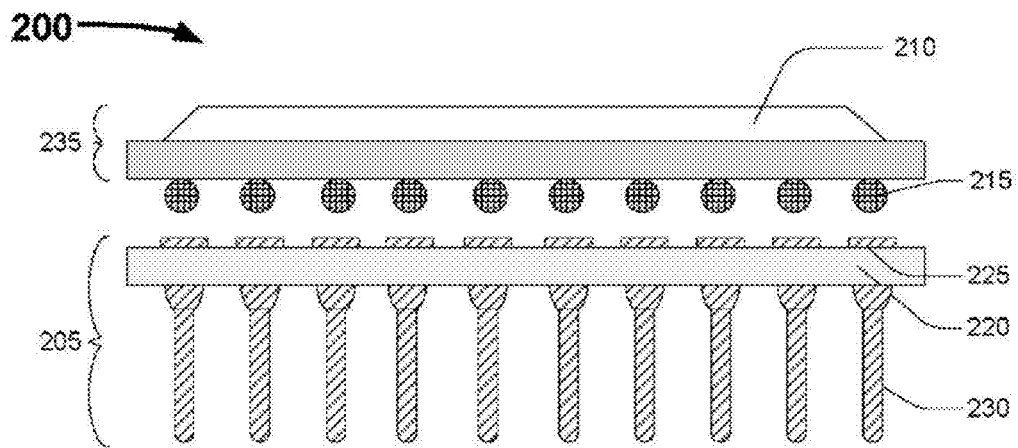
FIG. 2 is a sectional elevation view of another prior art external PGA adapter coupled to a BGA package.
Figure 3:
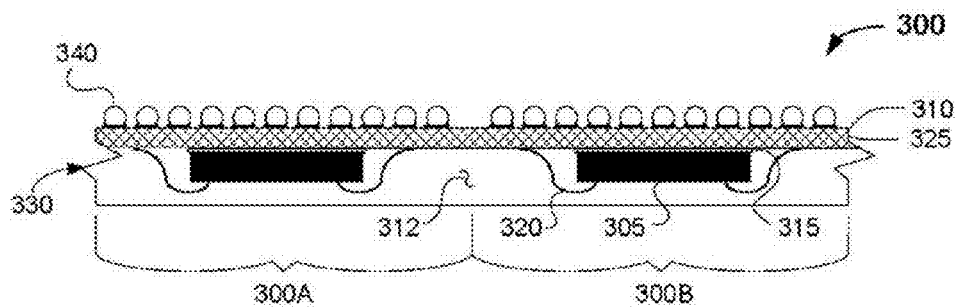
FIG. 3 is a sectional elevation view of a standard BGA array showing solder balls disposed on the BGA contact pads.

FIG. 3 shows a BGA array 330 having two of what will become separate BGA packages 300A and 300B. As is known in the formation of BGA packages, a large substrate 310 has a plurality, usually several hundred, semiconductor die 305 coupled to it. Since the formation steps for BGA packages at this stage are well known in the art, the details for creating the array of FIG. 3 will not be provided herein, and a summary of the current structure will be sufficient. Only two of the many hundreds of semiconductor die 305 that are coupled to the substrate at this stage are shown for ease of explanation.

Each of the semiconductor dies 305 are physically coupled to the underlying substrate 310 by a glue layer 315. The die are encapsulated in resin 312. One or more electrically conductive pathways, for example, in the form of bonding wires 320 and unseen vias and layers within the substrate 310, couple the semiconductor dies 305 to contact pads 325 disposed on the exterior surface of the substrate 310.

Solder balls 340 are affixed or otherwise held in place on the contact pads 325 using soldering flux or similar materials suitable for promoting the formation of good physical and electrical bonds between the solder ball 340 and the contact pad 325. Properly affixing or otherwise attaching the solder balls 340 to the contact pads 325 minimizes the likelihood of unwanted movement or dislodgement of the solder balls 340.

The solder balls 340 include any type or size solder balls capable of affixing or otherwise bonding the BGA package 330 to a substrate. The composition of the solder balls includes either eutectic mixtures such as lead/tin mixtures, or non-eutectic mixtures such as tin/silver/copper or tin/silver/copper/zinc mixtures. The solder balls 340 can range in diameter from about 0.1 mm to about 1 mm based in whole or in part upon the density or spacing of the BGA contact pads 325 and the final desired projection of the installed BGA package. Systems and methods for affixing the solder balls 340 on the BGA contact pads 325 are known in the art and any of such manual, automated or semi-automated methods may be used.

In this condition, the array 300 has completed BGA packages formed thereon. Some customers will wish to purchase BGA-type packages to place in their end products, such as cell phones, iPods, and the like. For those customers, the completed array of BGA of FIG. 3 is singulated and shipped. However, many customers wish to have the very same die, with the very same terminal alignments, for use in a pin grid array (PGA) type mount. This may be used in personal computers, iPads, and the like. Rather than having to start an entire new packaging line or provide an adaptor, the inventor has realized a new way to provide a PGA at a very low cost that is highly reliable and easy to modify for each different semiconductor die, as will now be explained.

Figure 4:
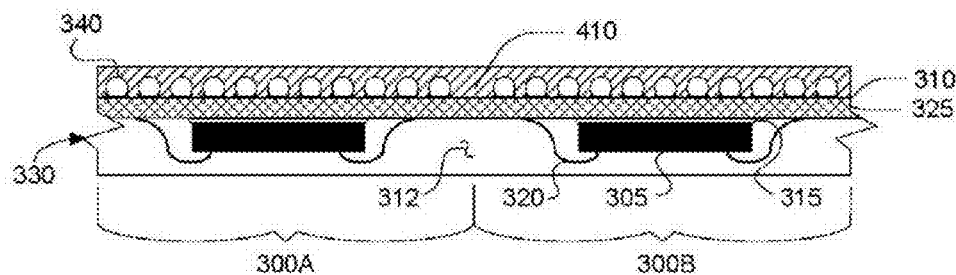
FIG. 4 is a sectional elevation view depicting an example BGA array where the solder balls are at least partially encapsulated in a fixed material.

FIG. 4 is the BGA package 330 with a fixed material 410 encapsulating the solder balls 340. The fixed material 410 is also disposed across and over both the entire substrate 310 and the contact pads 325. In some instances, the fixed material 410 completely encapsulates the solder balls 340 such that no portion of the solder balls 340 remains exposed after application of the fixed material 410. In other instances, the fixed material 410 only partially encapsulates the solder balls 340 such that a small portion of each of the solder balls 340 remains exposed after application of the fixed material 410.

After manufacture of the BGA package 330, contaminants such as residual flux, wax, mold release agents or other substances may be present on all or a portion of the substrate 310. According to one embodiment, these contaminants are removed using one or more cleaning techniques known in the art including, but not limited to, a water wash, an acid wash, a plasma etch, or similar surface preparation techniques. Cleaning contaminants from the substrate 310 prior to applying the fixed material 410 improves the strength of the physical bond between the fixed material 410 and the substrate 310 and aids to ensure electrical isolation of the solder balls 340 and the contact pads 325.

The fixed material 410 used to partially or completely encapsulate or cover the solder balls 340 may be disposed in a uniform or non-uniform manner about all or a portion of the solder balls 340, such as by spin on techniques while flowing the material. The fixed material 410 can include one or more thermoplastic or thermosetting materials applied as a solid, liquid, or any combination thereof. The fixed material 410 may cure, harden, cross-link, or otherwise become rigid after application to the BGA package 330. The curing of the fixed material 410 may be accomplished with or without the presence of an external activator such as ultraviolet (UV) light or heat.

In some embodiments, the fixed material 410 is a thermosetting epoxy-based material applied about the contact pads 325 and solder balls 340 as an uncured liquid that is either internally chemically cured or externally photo-chemically cured by exposure to UV light. In other embodiments, the fixed material 410 is a thermoplastic material applied about the contact pads 325 and solder balls 340 as an uncured solid that is cross-linked, cured, hardened or activated using heat.

In at least some instances, the fixed material 410 is a mold compound that is similar to that used for the encapsulant 312 to encapsulate the die 305. An example mold compound 410 is a thermosetting compound containing one or more epoxy resins, one or more phenolic hardeners, silica, one or more catalysts, one or more pigments, and one or more mold release agents.

After curing, the fixed material 410 is preferred to have a finished melting point in excess of the melting point of the solder used to form the solder balls 340. For example, where the solder balls 340 comprise a eutectic solder having a melting temperature of about 220° C., the melting point of the cured fixed material 410 is preferred to be significantly greater than 220° C. to permit the softening of the solder balls 340 without adversely affecting the physical or structural integrity of the fixed material 410. A melting point of the fixed material 410 above 330° C. is preferred and, in one embodiment, the melting point is above 420° C.

Figure 5:
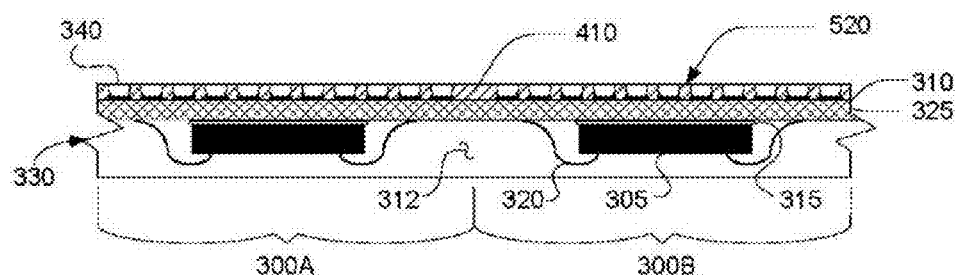
FIG. 5 is a sectional elevation view depicting an example BGA array where the solder balls have been exposed by removal of at least a portion of the solder ball and a portion of the fixed material.

FIG. 5 shows the array 330, with a portion of the solder balls 340 and a portion of the fixed material 410 removed to provide a layer comprising residual fixed material 410 and at least partially exposed solder balls 340. In a preferred embodiment, the residual fixed material 410 and the exposed solder balls 340 together form a layer having a relatively smooth, planar surface 520. However, in other embodiments, the fixed material 410 and the solder balls 340 may form an uneven or irregular surface 520. The removal of at least a portion of the fixed material 410 and the solder balls 340 is performed using one or more cutting and/or surface finishing techniques known in the art including, but not limited to, one or more grinding processes, one or more cutting processes, or one or more chemical-mechanical planarization (CMP) processes.

In the absence of the fixed material 410, the forces exerted on the solder balls 340 during the material removal process might be sufficient to dislodge the solder balls 340 from their respective underlying contact pads 325, for example, if CMP or grinding is used. The presence of the fixed material 410 and the strength of the bond between the fixed material 410 and the underlying substrate 310 retain each of the solder balls 340 in position proximate their respective contact pads 325 during the material removal process.

If a removal process of a part of the solder balls is sufficiently low stress that it would not dislodge the solder balls, such as cutting with a saw, then it may be possible to forego the encapsulation step of FIG. 4.

At the conclusion of the material removal process, the residual fixed material 410 continues to partially encapsulate the exposed solder balls 340 in their original location proximate the underlying contact pads 325 on the array 330.

The physical characteristics of both the fixed material 410 and the solder balls 340 determine the quantity of fixed material 410 removed during the material removal process. Physical characteristics affecting the material removal process include, but are not limited to, the depth and hardness of the fixed material 410 and the physical size, shape and configuration of the solder balls 340. At the conclusion of the material removal process, sufficient residual fixed material 410 is retained about the solder balls 340 to maintain the position of each of the solder balls 340 relative to each other and proximate their respective contact pad 325.

In a preferred embodiment using spherically shaped solder balls 340, at least 51% by volume of each of the solder balls 340 remains partially encapsulated by the fixed material 410 after the material removal process. Preserving within the fixed material 410 at least 51% by volume of the original solder ball 340 assists in retaining the solder ball 340 within the fixed material 410. In other embodiments, at least 60% of the original solder ball volume; at least 70% of the original solder ball volume; at least 80% of the original solder ball volume; or at least 90% of the original solder ball volume can be retained within the fixed material 410 after the material removal process.

Figure 6:
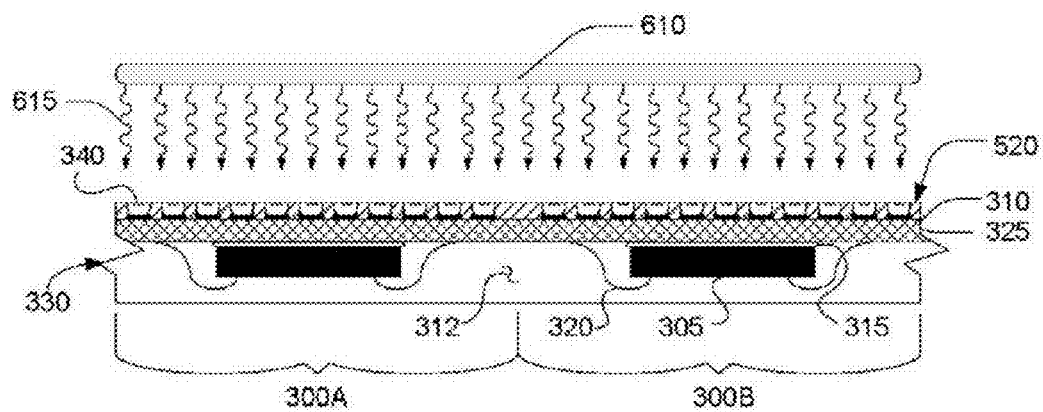
FIG. 6 is a sectional elevation view depicting an example BGA array where the exposed solder balls have been softened.

FIG. 6 is an external heat source 610 providing heat 615 to the fixed material 410 and the solder balls 340 forming the surface 520. Heat 615 can be distributed uniformly or non-uniformly across the surface 520. The external heat source 610 includes any system or device capable of outputting heat 615 sufficient to soften, partially melt, or completely melt the exposed solder balls 340. Example external heat sources 610 include, but are not limited to, infrared ovens, infrared convection ovens, or vapor phase ovens. The application of heat to the surface 520 begins to soften the solder balls 340 as the temperature of the solder balls approaches the melting point of the solder. The residual fixed material 410 partially encapsulating the solder balls 340 maintains the position of each of the softened solder balls 340 proximate their respective contact pad 325 and reduces the likelihood of shorting between the softened solder balls 340.

Heat 615 is applied to the surface 520 until a predetermined or threshold temperature is attained. In some instances, the predetermined or threshold temperature is a surface temperature, for example, a temperature at or below the melting temperature of the fixed material 410. In other instances, the predetermined or threshold temperature is a core temperature measured within the fixed material 410, within the solder balls 340 or at the contact pad 325, for example, a temperature providing desirable solder reflow characteristics at the contact pad 325. In one or more preferred embodiments, the predetermined or threshold temperature corresponds to the melting point or a temperature within the melting range of the solder forming the solder balls 340.

The type and melting point of the solder used in the solder balls 340 determines, in whole or in part, the threshold temperature. When the solder balls 340 have a defined melting point (i.e., a eutectic solder) the threshold temperature may be established at approximately the melting point of the solder. When the solder balls 340 have a defined melting range (i.e., a non-eutectic solder) the threshold temperature may be established within the melting range of the solder. The solder balls 340 may also be liquefied by raising the threshold temperature to a point above the melting point for eutectic solder balls or above the melting range for non-eutectic solder balls. Irrespective of the type of solder used, the solder balls 340 are in at least a softened state at the threshold temperature. The solder balls 340, in either a softened or liquid state, remain physically and electrically isolated, and partially encapsulated within the residual fixed material 410. The physical and electrical isolation of the solder balls 340 provided by the residual fixed material 410 facilitates subsequent handling of the array 330 with reduced concern over shorting attributable to splashing or spillage of the softened solder balls 340.

When a eutectic solder (i.e., a solder having a defined melting point) is used and a softened solder ball is desired, the threshold temperature can be about 10° C. less than the melting point; about 5° C. less than the melting point; about 2° C. less than the melting point; or about 1° C. less than the melting point. When a non-eutectic solder (i.e., a solder having a melting range or more than one melting point) is used and a softened solder ball is desired, the threshold temperature can be about 5° C. less than the lowest melting temperature; about 2° C. less than the lowest melting temperature; about 1° C. less than the lowest melting temperature; about 5° C. less than the highest melting temperature; about 2° C. less than the highest melting temperature; or about 1° C. less than the highest melting temperature.

Figure 7:
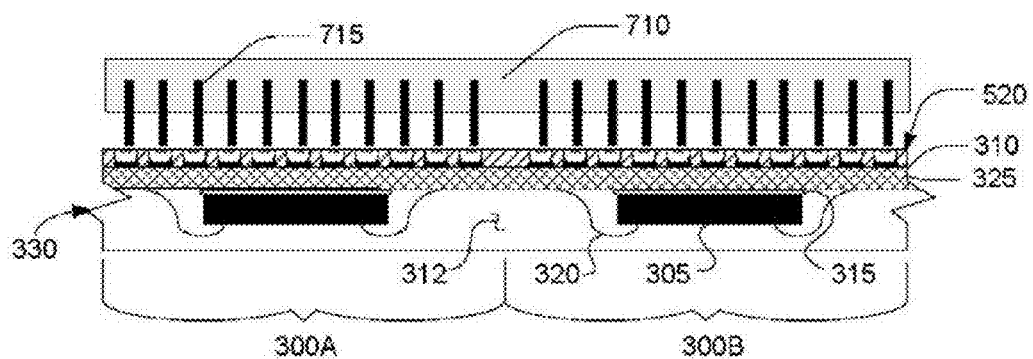
FIG. 7 is a sectional elevation view depicting a plurality of pin members proximate the softened solder balls on an example BGA array.

FIG. 7 is an insertion device 710 including a plurality of pin members 715 situated proximate and aligned with the softened solder balls 340. The plurality of pin members 715 are attached, coupled, or otherwise connected to the insertion device 710 in a predefined matrix or array that both aligns with the softened solder balls 340 and falls within allowable pin grid array pin pitch and spacing tolerances. The insertion device 710 uses a mechanical system, a vacuum based system, or a combination of mechanical and vacuum based systems to retain the plurality of pin members 715 prior to insertion into the softened solder balls 340. The insertion device 710 maintains the spacing between the pin members 715 in a regular or irregular pattern having a center-to-center spacing of less than about 10 mm; less than about 5 mm; less than about 4 mm; less than about 3 mm; less than about 2 mm; or less than about 1 mm.

Although the insertion device 710 is depicted for clarity as proximate a two semiconductor die array 330 in FIG. 7, in operation the insertion device 710 may be proximate tens, hundreds, or even thousands of semiconductor dies 305 forming the array 330. The use of the insertion device 710 provides manufacturing flexibility since the insertion device 710 may insert a first type of pin member 715 into a portion of the array 330 and a second type of pin member 715 into the remaining portion of the array 330. Thus, simultaneous production of multiple PGA compatible BGA packages 300A, 300B meeting differing customer specifications is possible.

In a preferred embodiment, the insertion device 710 is not configured for a fixed array size, pin count, or pin arrangement, and instead the insertion device 710 accommodates any array size, pin count, or pin arrangement. The pin members 715 are selectively loaded into the insertion device 710 based upon the array size, desired pin count, and/or desired pin arrangement. The ability to accommodate different array sizes, pin counts, and/or pin arrangements using a single insertion device 710 provides operational flexibility and facilitates the manufacture of arrays 330 having different sizes, pin counts, and/or pin arrangements without requiring the use of custom adapters and the like.

The insertion device 710 may include one or more temperature adjustment systems to heat or cool all or a portion of each of the plurality of pin members 715. Heating or cooling all or a portion of each of the plurality of pin members 715 can advantageously alter or affect the bonding between the pin member 715 and the solder ball 340. In some instances the insertion device 710 heats the plurality of pin members 715 using conductive heating, for example, where the temperature of the insertion device itself is raised or lowered to adjust the temperature of the plurality of pin members 715. In other instances, the insertion device 710 passes all or a portion of each of the pin members 715 through a temperature controlled environment, for example, an infrared oven.

Each of the plurality of pin members 715 includes a conductive structure suitable for physically engaging with and electrically coupling to a complimentary receptacle or socket. Each of the plurality of pin members 715 is either a solid structure having no internal void space, or a hollow structure having an internal void space extending partially or completely through the pin member. Each of the plurality of pin members 715 ranges in diameter from about 0.1 mm to about 0.9 mm; about 0.1 mm to about 0.7 mm; about 0.1 mm to about 0.5 mm; or about 0.1 mm to about 0.3 mm.

In at least some embodiments, the temperature of all or a portion of the plurality of pin members 715 may be adjusted prior to insertion into the softened solder balls 340. For example, the temperature of the plurality of pin members 715 may be increased above the melting temperature or melting range of the softened solder balls 340 to ease insertion of the plurality of pin members 715 within the softened solder balls 340. In another example, the temperature of the plurality of pin members 715 may be decreased below the melting temperature or melting range of the softened solder balls 340 to promote rapid solidification of the softened solder balls 340 after the plurality of pin members 715 are inserted. In yet another example, the temperature of the plurality of pin members 715 may be increased above the melting temperature or melting range of the softened solder balls 340 to ease insertion of the pin members 715 within the softened solder balls 340, followed by a decrease in temperature to promote rapid solidification of the softened solder balls 340.

Example insertion devices 710 include but are not limited to mechanical and vacuum devices for gripping, holding or otherwise securing the plurality of pin members 715. In at least some instances the insertion device 710 can heat at least a portion of each of the plurality of pin members 715 using a conductive heating system, an inductive heating system or any combination thereof. In at least some embodiments, the insertion device 710 includes a heating system configured to selectively change the temperature of only a portion of each of the plurality of pin members 715, for example, to heat the portion of each of the plurality of pin members 715 inserted into the softened solder balls 340.

Figure 8:
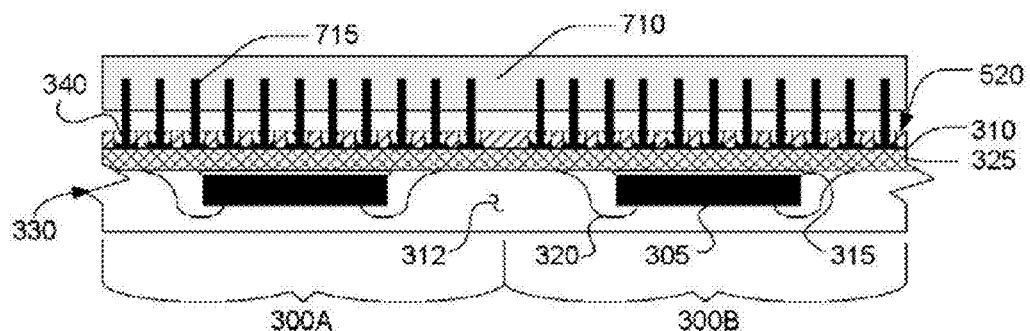
FIG. 8 is a sectional elevation view depicting the insertion of the plurality of pin members into the softened, exposed, solder ball, according to one or more embodiments.

FIG. 8 is an array 330 with a plurality of pin members 715 inserted into the softened solder balls 340 using the insertion device 710. The insertion device 710 holds the plurality of pin members 715 until the solder balls 340 solidify and are independently able to support the pin members 715. By holding the plurality of pin members 715 within the solder balls 340 until the solder balls are able to independently support the plurality of pin members, the spacing and alignment of the plurality of pin members is maintained within allowable pin grid array tolerances. For example, each of the plurality of pin members 715 may be maintained by the insertion device 710 within a positional tolerance of about 0.10 mm or less; about 0.08 mm or less; about 0.05 mm or less; about 0.03 mm or less; or about 0.01 mm or less.

Various parameters, including but not limited to, the temperature of the solder balls 340, the temperature of the plurality of pin members 715, and the rate of insertion of the plurality of pin members 715 into the solder balls 340, are adjusted to lessen the likelihood of splashing or running of the solder and to promote the formation of a solid physical and electrical bond between the contact pad 325, the solder ball 340, and the pin member 715.

In one embodiment, the solder balls 340 are at a temperature above the melting point or melting range of the solder and the pin members 715 are at a temperature below the melting point of the solder. The temperature of the solder balls 340 is about 10° C. or less above the melting point or melting range of the solder; about 5° C. or less above the melting point or melting range of the solder; or about 1° C. or less above the melting point or melting range of the solder. The temperature of the plurality of pin members 715 is about 10° C. or less below the melting point or melting range of the solder; about 5° C. or less below the melting point or melting range of the solder; or about 1° C. or less below the melting point or melting range of the solder. The rate of insertion of the plurality of pin members 715 must be sufficiently high to allow the pin member to penetrate to an adequate depth prior to the solidification of the solder ball, yet sufficiently low to avoid splashing or running of the melted solder during the insertion process.

In a preferred embodiment, the solder balls 340 are at a temperature below the melting point or melting range of the solder and the plurality of pin members 715 are at a temperature above the melting point of the solder. Maintaining the solder balls 340 in a solid or softened state prior to the insertion of the plurality of pin members 715 lessens the likelihood of splashing or running of the solder during subsequent processing of the array 330. The temperature of the solder balls 340 is about 10° C. or less below the melting point or melting range of the solder; about 5° C. or less below the melting point or melting range of the solder; or about 1° C. or less below the melting point or melting range of the solder. The temperature of the plurality of pin members 715 is about 10° C. or less above the melting point or melting range of the solder; about 5° C. or less above the melting point or melting range of the solder; or about 1° C. or less above the melting point or melting range of the solder. The relatively warm pin members 715 cause the solder to melt upon contact, thereby permitting the insertion of the pin member 715 into the solder ball 340. The rate of insertion of the pin member is sufficiently slow to allow the solder balls 340 to melt, yet sufficiently high to allow the plurality of pin members 715 to penetrate to an adequate depth within the solder balls 340. The plurality of pin members 715 cool upon contact with the solder balls 340, thereby solidifying the solder balls 340 at a rate promoting the formation of a fillet between each pin member 715 and its respective solder ball 340.

The plurality of pin members 715 remain attached, coupled, connected or otherwise supported by the insertion device 710 until the softened solder balls 340 solidify or harden sufficiently to maintain the position of the plurality of pin members 715 within an acceptable tolerance. In some instances, the insertion device 710 itself can cool or otherwise convey heat away from all or a portion of the plurality of pin members 715 to hasten the solidification or hardening of the softened solder ball 340, for example, by passing a cooling media through all or a portion of the insertion device 710. In other instances, the insertion device 710 can maintain the position of the plurality of pin members 715 while an external cooling medium, for example, an air sweep, solidifies or hardens the softened solder balls 340.

Figure 9:
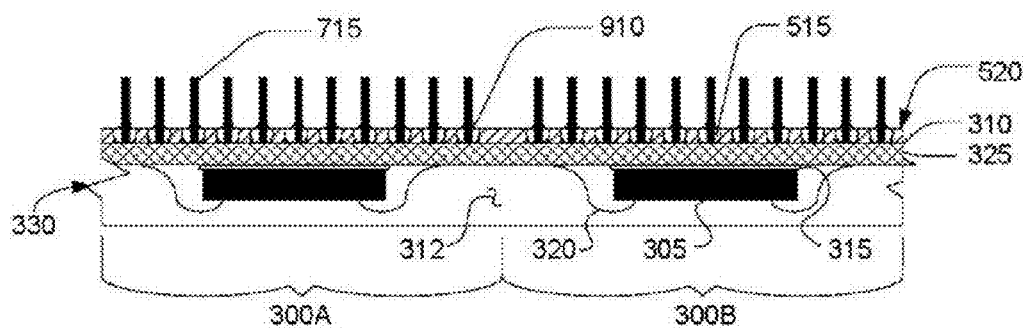
FIG. 9 is a sectional elevation view depicting the solidification of the exposed solder ball to affix the pin member to the solder ball, according to one or more embodiments.

FIG. 9 is the array 330 with pin members 715 inserted into solidified solder balls 340. A fillet 910 has formed between each pin member 715 and its respective solder ball 340, strengthening the physical bond between the pin member 715 and its respective solder ball 340. The fillet 910 also assists in the retention of each of the plurality of pin members 715 within allowable tolerances in the array 330. Both the physical and electrical integrity of the array 330 is enhanced by the presence of the residual fixed material 410 disposed between the solder balls 340. No additional structures, adapters, or the like are required, thus the resultant array 330 provides a unified physical structure with the pin members 715 rigidly affixed to the contact pads 320 via the solder balls 340 and the residual fixed material 410 affixed to the substrate 310.

Selectively controlling some or all parameters including, but not limited to, the heating of the solder balls 340, the heating of the pin members 715, the insertion speed of the pin members 715 into the solder balls 340, and/or the cooling of the solder balls 340 to provide conditions favorable for wicking or capillary flow of the liquid solder along the pin member 715 promotes the formation of the fillet 910.

After insertion of the plurality of pins 715 and the solidification of the solder balls 340, the resultant array 330 comprises a plurality of PGA compatible BGA packages 300A, 300B, each comprising at least one semiconductor die 305. The plurality of PGA compatible BGA packages 300A, 300B is separated into individual PGA compatible BGA packages by cutting along the cut lines 1010 partitioning the array 330.

Figure 10:
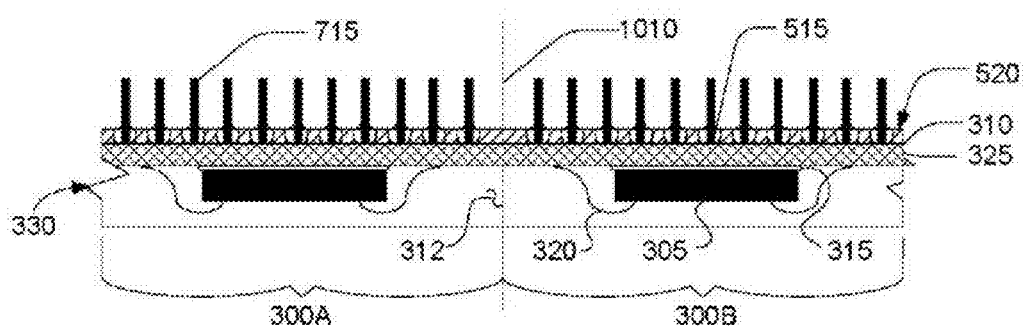
FIG. 10 is a sectional elevation view depicting the partitioning of the array into a plurality of individual PGA compatible BGA packages, according to one or more embodiments.
Figure 11:
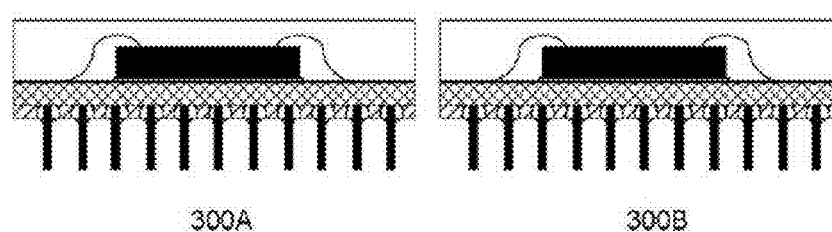
FIG. 11 is a sectional elevation view depicting a plurality of individual PGA compatible BGA packages, according to one or more embodiments.

FIG. 10 is a cut line shown on the array 330 to separate the array 330 into independent PGA compatible BGA packages, each comprising a plurality of PGA compatible pins coupled to the BGA contact pads 325. Although two identical PGA compatible BGA packages 300A and 300B are depicted for clarity and ease of discussion, the array 330 may comprise a plurality of dissimilar packages, for example, a mixture of BGA packages and PGA compatible BGA packages, or a mixture of PGA compatible BGA packages each containing differing numbers of semiconductor dies, pin member counts, pin member arrangements and/or pin member types. The process of separating the array 330 into a plurality of individual PGA compatible BGA packages 300A, 300B is well known in the art and is not discussed in detail. The separation of the array 330 is accomplished using any available technique employed in the art, for example, by saw cutting the array 330. The PGA compatible BGA packages 300A and 300B are separated to provide two discrete, independent, PGA compatible BGA packages 300A and 300B in FIG. 11.

Figure 12:
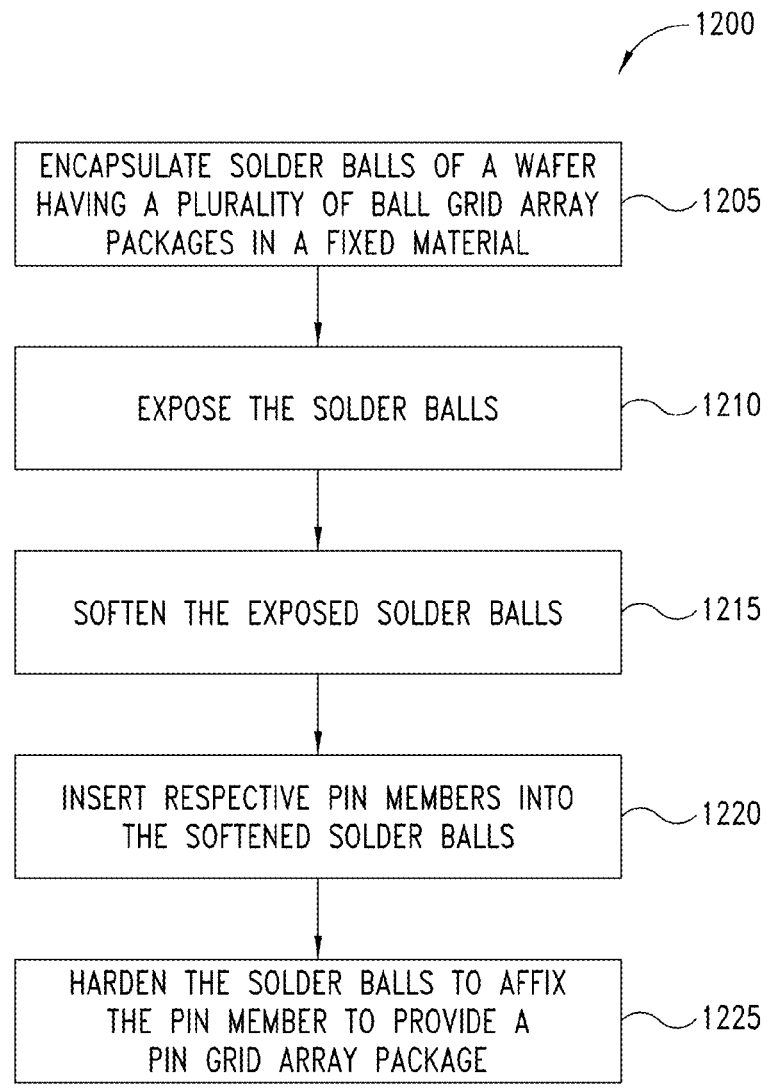
FIG. 12 is a flow diagram depicting an example PGA production method, according to one or more embodiments.

FIG. 12 provides one example method for converting a single BGA package 330 to a PGA package. The method commences with a single BGA array package 330 having a plurality of solder balls 340 attached to the contact pads 325. The solder balls 340 may be affixed to the contact pads 325 using any techniques known in the art, such as through the use of a flux compound. Given the proximity of the contact pads 325 on the BGA array package 330, precise positioning and retention of the solder balls 340 on the individual contact pads 325 is desirable.

The illustrative method 1200 commences with a BGA array package 330 having solder balls 340 affixed to each of the contact pads 325 using flux to prevent loss or physical displacement of the solder balls 340. At 1205, the solder balls 340 are encapsulated with a fixed material 410. The fixed material 410 used to encapsulate the solder balls 340 can include, but is not limited to, a thermosetting material such as that used to encapsulate the semiconductor dies 305. Other thermoplastic or thermosetting materials having similar physical properties, including resiliency, physical strength, and sufficiently high melting point may be substituted. The fixed material 410 forms a rigid structure about the solder balls 340 and secures the solder balls 340 in location on the contact pads 325.

At 1210 the solder balls 340 are exposed by removing a portion of the fixed material 410 and a portion of the solder balls 340. The removal of the fixed material 410 and the solder balls 340 is accomplished using any known technique including but not limited to cutting, grinding, or chemical-mechanical polishing of the fixed material 410 and the solder balls 340. The presence of the fixed material 410 aids in retaining the solder balls 340 proximate the contact pads 325 during the material removal process. After the material removal process is completed, the residual fixed material 410 continues to partially encapsulate each of the now exposed solder balls 340, affixing each of the exposed solder balls 340 proximate their respective contact pad 325. In the preferred embodiment, the presence of the residual fixed material 410 provides an integrated structure linking the residual fixed material 410 to the substrate 310 and the exposed solder balls 340 to the underlying contact pads 325.

Exposing the solder balls 340 at 1210 permits the softening of the solder ball 340 via the application of heat 615 without exposing the entire array 330 to the heat source, in other words only the portion of the array 330 (the portion containing the residual fixed material 410 and exposed solder balls 340) need be exposed to the heat source 610 to soften the exposed solder balls 340. Additionally, the increased cross-sectional area presented by the exposed solder balls at 1210 accommodates any misalignment of pin members 715 during the insertion process discussed in 1220.

At 1215, the exposed solder balls 340 are softened by applying heat 615, for example, using an infrared heater to raise the temperature of the exposed solder balls 340. Softening the solder balls 340 improves the physical and electrical contact between the solder balls 340 and the underlying contact pads 325. Additionally, softening the solder balls 340 also eases the insertion of the pin member 715 into the solder ball 340 without damaging the plurality of pin members 715 or causing splashing or unacceptable running of the solder across the residual fixed material 410 causing shorts between the solder balls 340 and/or contact pads 325.

The presence of the residual fixed material 410 between the solder balls 340 permits the softening of the solder balls 340 with reduced risk of shorting between the solder balls 340 and/or the contact pads 325. The residual fixed material 410 also assists in retaining the softened solder balls 340 proximate their respective contact pad 325. Should the temperature of the solder balls 340 be increased above the melting temperature or melting range of the solder, the residual fixed material 410 retains the liquefied solder proximate the contact pad 325.

At 1220, a pin member 715 is inserted into the softened solder ball 340. An insertion device 710 is used to align the plurality of pin members 715 with the softened solder balls 340 and to maintain the plurality of pin members 715 within allowable PGA pin spacing, pitch, and alignment tolerances. The plurality of pin members 715 may be heated prior to insertion into the solder balls 340. For example, the plurality of pin members 715 may be heated to a temperature greater than the melting temperature or melting range of the solder balls 340 prior to insertion. In one or more preferred embodiments, the temperature of the solder balls 340, the temperature of the plurality of pin members 715, or the temperature of both the solder balls 340 and the plurality of pin members 715 are selected to reduce the possibility of splashing or running of the solder when inserting the plurality of pin members 715 into the solder balls 340.

In a preferred embodiment, the solder balls 340 are heated to a temperature slightly below the melting temperature or melting range of the solder while the plurality of pin members 715 are heated to a temperature slightly above the melting temperature or melting range of the solder. The relatively warm plurality of pin members 715 are brought into contact with the solder balls 340, causing the solder to melt and allowing the insertion of the plurality of pins 715 into the solder balls 340.

After insertion of the plurality of pin members 715 into the softened solder balls 640, the insertion device 710 maintains the position of the plurality of pin members 715 until the solder balls 340 solidify sufficiently to maintain the position of the plurality of pin members 715 at 1225. In a preferred embodiment, the cooling of the plurality of pin members 715, the solder balls 340, or both the plurality of pin members 715 and the solder balls 340, is selected to promote the formation of a fillet 910 between each of the plurality of pin members 715 and its respective solder ball 340.

Upon solidification of the solder balls 340, the plurality of pin members 715 provide an array comprising a plurality of PGA compatible BGA packages 300A, 300B. Each of the PGA compatible BGA packages is usable directly in a PGA compatible socket without the need for intervening adapters. Outwardly, the PGA compatible BGA package 300A, 300B resembles a conventional PGA package with the residual fixed material 410 forming the "bottom" of the package and the plurality of pin members 715 forming the PGA pin array extending from the "bottom" of the package, i.e., from the residual fixed material 410.

In the preferred embodiment, the substrate 310 and the residual fixed material 410 are flush fitted without a gap, further lending to the unified appearance of the PGA compatible array BGA package 300A, 300B. The presence of the residual fixed material 410 at least partially encapsulates the solder balls 340, adding strength and resiliency to the PGA compatible array BGA package 300A, 300B. The formation of fillets 910 between each of the solder balls 340 and each of the pin members 715 provides additional physical strength, holding each of the plurality of pin members 715 in position within the PGA compatible array BGA package 300A, 300B.

Figure 13:
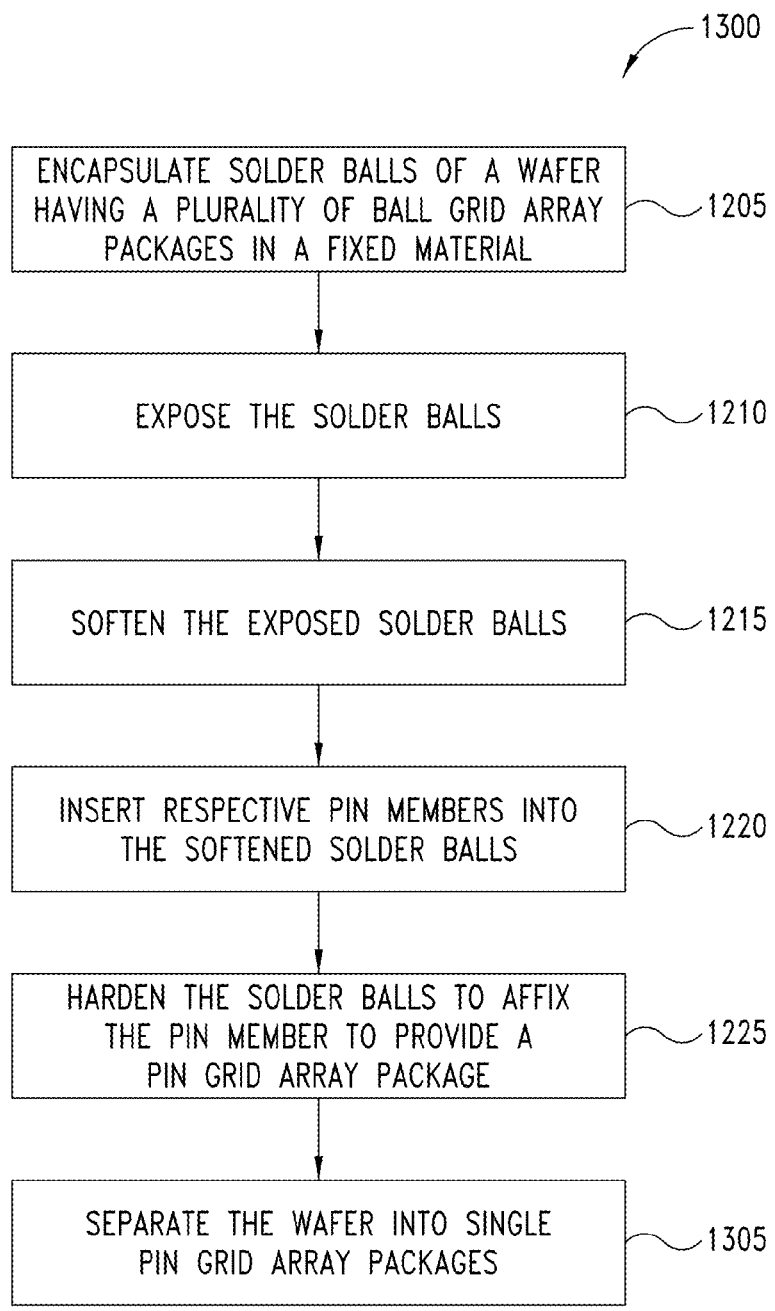
FIG. 13 is a flow diagram depicting another example PGA production method, according to one or more embodiments.

FIG. 13 is another illustrative process 1300 for providing a plurality of PGA compatible array BGA packages 300A, 300B from a very large array, such as a large reconstituted wafer. After solidification of the solder balls, the array 330 comprises hundreds, or even thousands of individual PGA compatible BGA packages 300A, 300B, with each having at least one semiconductor die 305. The steps proceed in this large array similar to those described for FIG. 12. At the end of the process, the array 330 is separated to provide individual PGA compatible array BGA packages 300A and 300B, each formed by the addition of the fixed material 410 and the plurality of pin members 715 to the original BGA package 300A, 300B. The array 330 is separated at 1305 using any separation technique known in the art, for example, sawing or cutting apart into individual packages.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of making a pin grid array package, comprising:
- affixing a solder ball to a contact pad of a ball grid array package;
- encapsulating the solder ball within a fixed material;
- forming a planar surface that includes a surface of each of the solder ball and a surface of the fixed material;
- softening the solder ball;
- inserting a pin member into the softened solder ball;
- cooling the solder ball to rigidly affix the pin member to the solder ball to provide a pin grid array assembly; and
- separating the pin grid array assembly into a plurality of individual pin grid array packages to provide discrete pin grid array packages.

2. The method of claim 1 wherein encapsulating the solder ball within the fixed material comprises:
- disposing a thermosetting mold compound around the solder ball; and
- curing the thermosetting mold compound to provide the fixed material encapsulating the solder ball.

3. The method of claim 1 wherein softening the solder ball comprises:
- selectively heating the solder ball to increase a temperature of the solder ball to slightly less than a melting point of the solder ball.

4. The method of claim 1 wherein softening the solder ball comprises:
- selectively heating the solder ball to increase a temperature of the solder ball to at least a melting point of the solder ball.

5. The method of claim 1 wherein inserting the pin member into the softened solder ball comprises:
- increasing a temperature of at least a portion of the pin member to at least a melting point of the solder ball; and
- inserting the increased temperature portion of the pin member into the softened solder ball.

6. The method of claim 1 wherein cooling the solder ball to rigidly affix the pin member to the solder ball comprises:
- selectively cooling the pin member and the solder ball at a rate promoting the formation of a fillet between the solder ball and the pin member.

7. A pin grid array package, comprising:
- an integrated circuit having a plurality of contact pads thereon;
- an insulating layer adjacent the integrated circuit;
- a plurality of solder balls formed as a ball grid array, each surrounded by a fixed material and coupled to a respective contact pad of the integrated circuit, a surface of the fixed material and a surface of each of the plurality of solder balls being coplanar;
- a plurality of pin members having a first end inserted within each of the plurality of solder balls, respectively and a fillet formed between each of the plurality of pin members and the respective solder ball into which the pin member has been inserted.

8. The pin grid array package of claim 7 wherein the fixed material comprises:
- a thermosetting mold compound bonded about the contact pads of the ball grid array.

9. A method of converting a ball grid array package to a pin grid array package, comprising:
- encapsulating a plurality of solder balls of the ball grid array package with encapsulation material;
- forming a planar surface that includes a surface of each of the plurality of solder balls and a surface of the encapsulation material;
- softening the plurality of solder balls;
- inserting a respective pin member into each of the plurality solder balls to form a pin grid array assembly; and
- separating the pin grid array assembly into a plurality of individual pin grid array packages to provide discrete pin grid array packages.

10. The method of claim 9 wherein softening the plurality of solder balls comprises:
- exposing the solder balls to a forced air convection heater or an infrared heater.

11. The method of claim 9 wherein softening the plurality of solder balls comprises:
- increasing a temperature of the plurality of solder balls the temperature approximately equal to a melting temperature of the solder ball.

12. The method of claim 9, further comprising:
- increasing a temperature of the plurality of pin members to a temperature exceeding a melting temperature of the plurality of solder balls prior to inserting the respective pin member into each of the plurality of solder balls.

* * * * *

UNITED STATES PATENT AND TRADEMARK OFFICE
CERTIFICATE OF CORRECTION

| | | |
|---|---|---|
| PATENT NO. | : 8,637,352 B2 | Page 1 of 1 |
| APPLICATION NO. | : 13/302602 | |
| DATED | : January 28, 2014 | |
| INVENTOR(S) | : Kim-Yong Goh | |

It is certified that error appears in the above-identified patent and that said Letters Patent is hereby corrected as shown below:

In the Claims

Column 14, Line 35, Claim 11:
"increasing a temperature of the plurality of solder balls the" should read, --increasing a temperature of the plurality of solder balls to the--.

Signed and Sealed this
Eighteenth Day of November, 2014

Michelle K. Lee
*Deputy Director of the United States Patent and Trademark Office*